United States Patent [19]
Makinouchi

[11] Patent Number: 5,677,754
[45] Date of Patent: Oct. 14, 1997

[54] SCANNING EXPOSURE APPARATUS

[75] Inventor: Susumu Makinouchi, Kanagawa-ken, Japan

[73] Assignee: Nikon Corporation, Tokyo, Japan

[21] Appl. No.: 490,764

[22] Filed: Jun. 15, 1995

[30] Foreign Application Priority Data

Jun. 17, 1994 [JP] Japan .................................. 6-135616

[51] Int. Cl.$^6$ .............................. G03B 27/42; H01L 21/30
[52] U.S. Cl. .................................. 355/53; 355/50; 355/55; 355/67; 396/118
[58] Field of Search ................................ 355/50, 53, 68, 355/69, 71, 55, 67; 396/111, 115, 116, 118, 120; 250/548

[56] References Cited

U.S. PATENT DOCUMENTS

| | | |
|---|---|---|
| 4,924,257 | 5/1990 | Jain . |
| 5,194,893 | 3/1993 | Nishi . |
| 5,227,839 | 7/1993 | Allen . |
| 5,255,051 | 10/1993 | Allen . |
| 5,281,996 | 1/1994 | Bruning et al. . |
| 5,285,236 | 2/1994 | Jain . |
| 5,291,240 | 3/1994 | Jain . |
| 5,567,928 | 10/1996 | Sano ............................ 250/205 |

FOREIGN PATENT DOCUMENTS 4-196513  7/1992  Japan .

*Primary Examiner*—Arthur T. Grimley
*Assistant Examiner*—Herbert Kerner
*Attorney, Agent, or Firm*—Armstrong, Westerman, Hattori, McLeland & Naughton

[57] ABSTRACT

A reticle is scanned in a predetermined direction relative to an illumination field of a predetermined shape. In synchronism therewith, a shot-area defined on a photo-sensitive substrate (or wafer) is scanned in the opposite direction relative to an exposure field which is optically conjugate to the illumination field. Through these scanning operations, a pattern formed on the reticle is transferred onto the shot-area on the photosensitive substrate. The illuminance of an illumination light is measured during a time period when the illumination field is in an acceleration region and before reaching the shot-area, and the amount of exposure onto the shot-area is controlled based on the results of the measurement. In this manner, the amount of exposure onto the photosensitive substrate can be controlled to the correct amount of exposure even when the illuminance of the illumination light for exposure tends to vary in a relatively short interval, while a reduction in the throughput of the exposure process can be prevented.

57 Claims, 4 Drawing Sheets

SCANNING EXPOSURE APPARATUS

BACKGROUND OF THE INVENTION

1. Field of the Invention

The present invention relates to a scanning exposure apparatus of a so-called "slit-scan" or "step-and-scan" type, in which a mask (or reticle) and a photosensitive substrate (or wafer) are synchronously scanned with respect to an illumination field of, for example, a rectangular shape or an arc shape so as to sequentially project for exposure an image of a pattern on the mask onto the photosensitive substrate.

2. Description of the Related Art

There have been used various projection exposure systems in which a pattern formed on a reticle (or photomask) is projected through a projection optical system for exposure onto a photoresist-coated wafer (or glass substrate or the like) for fabricating semiconductor elements, liquid crystal display elements, thin film magnetic heads, etc. by using photolithography techniques. Recently, patterns for a single semiconductor element chip have become larger and larger. Thus, it is desired with respect to the projection exposure apparatus to enlarge the exposure field so that a larger image of a larger pattern on the reticle can be projected onto a wafer. However, to satisfy this requirement by using such techniques wherein the entire wafer is exposed with a one-shot exposure, the projection exposure apparatus must be provided with a projection optical system having high resolution over a very large exposure field covering the entire wafer, and such a projection optical system is inevitably large and expensive.

It is desirable to enlarge an exposure field by using relatively small and inexpensive exposure apparatuses of a so-called "slit-scan" type in an optical projection system. In the slit-scan type exposure apparatus, a reticle is scanned relative to an illumination field which has, for example, a rectangular, arc or trapezoid a1 shape (hereinafter, referred to as "slit-shaped illumination field"). In synchronism with the scanning, a wafer is also scanned relative to a slit-shaped exposure field which is conjugate to the slit-shaped illumination field, so that an image of a pattern on the reticle is serially projected onto each shot-area on the wafer. When a plurality of shot-areas on the wafer are exposed with the slit-scan technique, a moving operation from one shot-area to another is performed in a stepping manner, and thus, this exposure technique is also called a "step-and-scan" technique.

Generally, various photosensitive compounds such as photoresists coated on wafers are established to receive predetermined proper amounts of exposures, respectively. Most exposure apparatuses are, therefore, provided with an exposure control system for controlling the amount of exposure onto the wafer. When the entire wafer is exposed by one-shot exposure, both the reticle and the wafer remain stationary during the exposure operation, and the amount of exposure E is determined as a product of the illuminance I of the illumination light for exposure and the exposure time t, that is, $E = I \times t$.

In contrast, in the scanning exposure apparatuses such as those of slit-scan type or step-and-scan type, the exposure time $t = D/V_w$, where D is the width of the slit-shaped exposure field in the scanning direction and $V_w$ is the scanning velocity of the wafer. Thus, the amount of exposure $E_w$ onto the wafer is expressed as follows:

$$E_w = I \times D / V_w \qquad (1)$$

The width D of the slit-shaped exposure field is fixed in most cases, and the illuminance I of the illumination light emitted from the exposure light source tends to be subject to fluctuation and is difficult to control. For this reason, it is common to many conventional scanning exposure apparatuses that the exposure light source is actuated to emit (this is called "dummy emission") before the wafer to be exposed is loaded on a wafer stage prior to an actual exposure operation sequence, and an illuminance sensor, which is provided, for example, on a light path in the illumination optical system, measures the illuminance of the illumination light emitted. Based on the measurement and the proper amount of exposure for the photoresist used, a desired scanning velocity $V_w$ is determined by calculation using the equation (1) above. When an actual exposure operation is made using the scanning exposure technique, the scanning velocity of the wafer is set to the determined scanning velocity ($V_w$) and the scanning velocity of the reticle is set to the velocity corresponding to said velocity ($V_w$), to control the amount of exposure onto the wafer.

As described, in conventional exposure techniques, the amount of exposure of multiple shot-areas on the wafer is controlled based on the illuminance which is measured before that wafer is loaded on the wafer stage. Therefore, if the light intensity of the used exposure light source tends to vary in a relatively short interval, some of the multiple shot-areas on the wafer which are exposed at a later stage in the whole exposure operation sequence for that wafer, are subject to undesirable amount of exposures outside the proper exposure range.

Moreover, most of the conventional exposure techniques are subject to a common drawback in that a separate or independent illumination measuring step must be performed exclusively for measuring purposes before the wafer is loaded on the wafer stage, so that they can provide only relatively low throughput (i.e., the number of wafers to be processed per unit time) of the exposure process. However, if the measurement operations were performed less frequently in order to reduce the total time consumed for the illumination measurement, it would result in an increase in the risk of deviation of the amount of exposures out of the proper exposure range.

SUMMARY OF THE INVENTION

It is an object of the present invention to provide a scanning exposure apparatus in which the illuminance of an illumination light is measured during a time period when an illumination field of a predetermined shape is positioned in a region other than that of a transfer pattern on a mask (or reticle) to be scanned (e.g., during an acceleration period when the mask (or reticle) and a substrate (or wafer) are running in synchronism with each other while being accelerated), and the amount of exposure for the substrate is controlled by an exposure control device. In this manner, a proper amount of exposure for the substrate can be provided even when the illuminance of the illumination light for exposure tends to vary in a relatively short interval, while a reduction in the throughput for the exposure process can be prevented.

It is another object of the present invention to provide a scanning exposure apparatus of the type described above, in which a shutter member is disposed for completely preventing the illumination light from reaching the substrate while the illuminance of the illumination light is measured.

It is a further object of the present invention to provide a scanning exposure apparatus of the type described above, in which a variable field stop for changing the width, in the scanning direction of the mask, of the predetermined shape illumination field also serves as the shutter member. This allows a reduction in the number of necessary parts, compared to the apparatus in which a variable stop and a shutter member are provided independently.

In order to achieve the above and other objects, according to one aspect of the present invention, there is provided a scanning exposure apparatus comprising: an illumination optical system for illuminating, with an illumination light for exposure, an illumination field of a predetermined shape on a mask, the mask having a transfer pattern formed thereon which is to be transferred onto a photosensitive substrate; a scanning stage for synchronously scanning the mask and the substrate; an illuminance measuring device for measuring the illuminance of the illumination light during a time period when the illumination field of said predetermined shape is positioned in a region other than that of the transfer pattern on the mask; and an exposure control device for controlling the amount of exposure of the substrate when an image of the transfer pattern on the mask is projected for a scanning exposure onto the substrate, based on the results of the measurement from the illumination measuring device.

In a scanning exposure apparatus, when a scanning stroke is commenced, some time must be taken to accelerate the initially stationary mask (R) and substrate (W) to the scanning velocity appropriate for the exposure, or, in other words, there must be an acceleration period in which the mask and the substrate are accelerated. The above apparatus of the present invention can effectively utilize such an acceleration period to measure the illuminance of the illumination light. Alternatively, a deceleration period in which the mask and the substrate are decelerated after the completion of scanning exposure of one shot-area, or a transfer period in which an exposure field is moved from one shot-area to another may be utilized to measure the illuminance as well. When the illumination light is a pulsed light, a product of the averaged pulse energy and the number of light pulses emitted per unit time may be considered as the illuminance of the illumination light. Therefore, utilizing the acceleration (or deceleration or transfer) period to measure the illuminance eliminates the necessity to use a separate or an independent illuminance measuring time exclusively for the measuring purpose, so that illumination measurement can be performed frequently, that is, performed for each shot-area. As a result, a highly precise measurement of the illuminance can be made even if the illuminance of the illumination light for exposure varies in a relatively short interval, and thereby a highly precise control of the amount of exposure can be made. Because no separate or independent illuminance measuring time exclusively for the measuring purpose is used as described above, a high throughput can be achieved.

After the measurement operation of the illuminance, new desired values are determined, which are, for example, of the velocity $V_W$ of the substrate, or the illuminance I and the width D of the illumination field in the scanning direction used for obtaining the proper amount of exposure from the equation (1) shown above (i.e., $E_W = I \times D/V_W$), and the determined new values are used to control the amount of exposure for the subsequent exposure operation.

In the apparatus wherein an illuminance measurement device is disposed between the shutter member and the exposure light source in the illumination optical system, the illumination light is blocked by the shutter member when an image of the mask pattern is not projected for exposure onto the substrate (W) under the condition that the exposure field is positioned within an acceleration range. Even in this case, the illuminance can be measured by the illuminance measurement device.

Further, a variable stop for changing the width, in the scanning direction of the mask, of the illumination field of the predetermined shape may be disposed on a plane in the illumination optical system, which plane is substantially conjugate to a surface of the mask on which the pattern is formed. This variable stop may also serve as a shutter member. In this apparatus, when an exposure is made by a scanning exposure technique, control is performed, as shown in FIGS. 2(a)–2(f), with the edges of the projecting image of the variable stop being coincident with the light-blocking bands (20A, 20C, 20E) surrounding the patterns (20A, 20B) on the mask (R). This prevents the transfer of any pattern other than the appropriate pattern from being transferred onto the photosensitive substrate (W), and allows a precise measurement of the illuminance of the illumination light. Further, this eliminates the necessity to provide a member to be used exclusively as a shutter.

DESCRIPTION OF THE PREFERRED EMBODIMENTS

An embodiment of a scanning exposure apparatus according to the present invention will now be described with reference to the accompanying drawings. This embodiment illustrates a step-and-scan type projection exposure apparatus.

Figure 1:
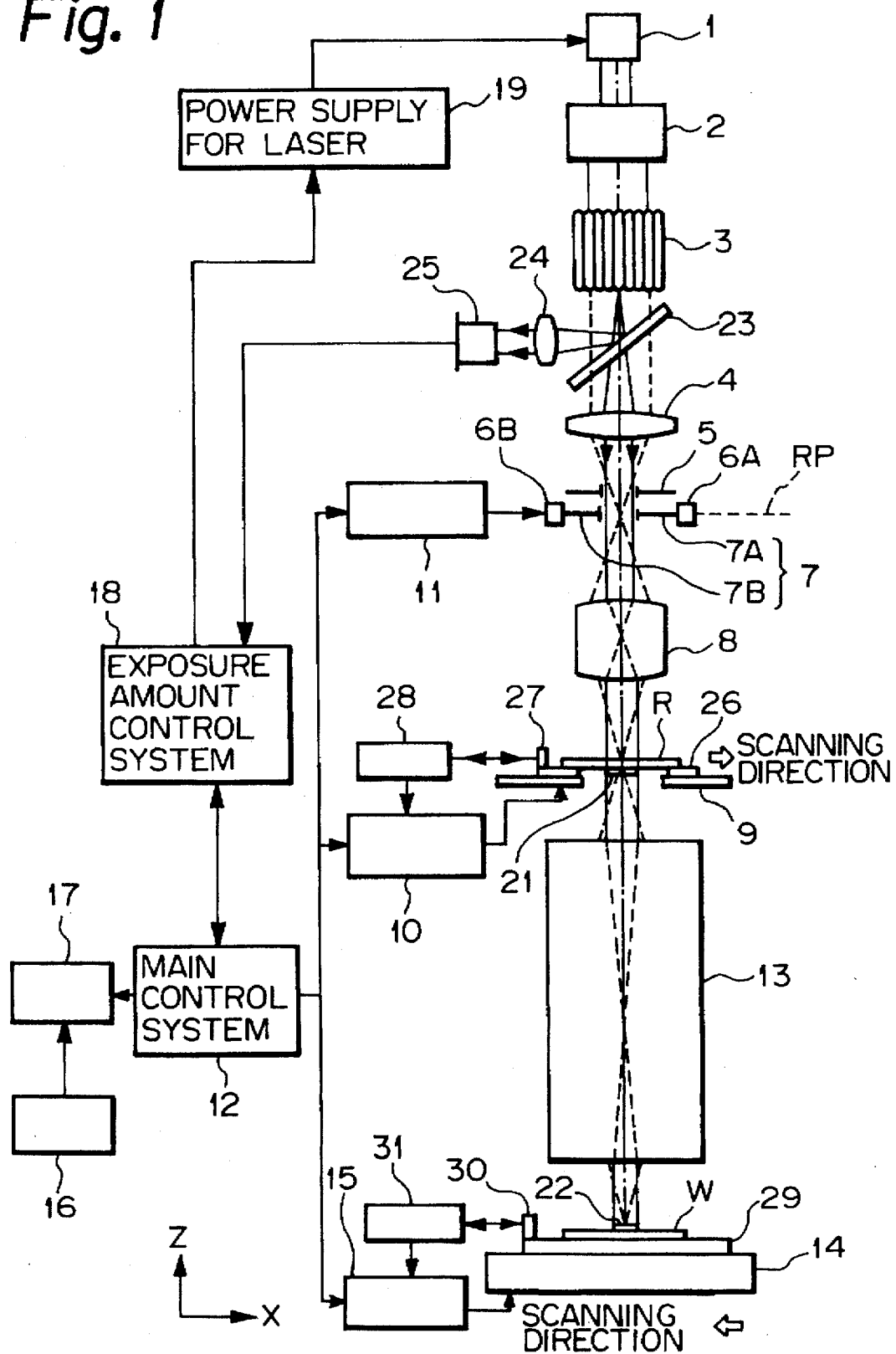
FIG. 1 is a schematic showing an embodiment of a scanning exposure apparatus according to the present invention.

FIG. 1 shows the embodiment of the projection exposure apparatus. In FIG. 1, a reticle R is illuminated by an excimer laser source 1 through an illumination optical system. The excimer laser source 1 is a pulsed light source. The illumination optical system comprises a beam-shaping system 2, a fly-eye lens 3, a condenser lens 4, a fixed field stop 5, a movable blind 7 and a relay lens system 8. The excimer laser 1 and the illumination optical system form a rectangular, slit-shaped illumination field 21 on the reticle R with a constant illuminance. The circuit patterns on the reticle R, which circuit patterns reside within the slit-shaped illumination field 21, is transferred through an exposure optical system 13 onto a wafer W. In this embodiment, the excimer laser source 1 may comprise, for example, a KrF excimer laser (operating at 248 nm wavelength). Alternatively, an ArF excimer laser (operating at 193 nm wavelength) may be used. Further, metal vapor lasers and YAG lasers with appropriate harmonics generators may be used as the exposure light source.

In FIG. 1, a light beam formed by the pulsed illumination light emitted form the excimer laser source 1 is incident to the beam-shaping optical system 2. The beam-shaping optical system 2 includes a cylindrical lens and a beam expander (both not shown) and expands the diameter of the beam. Then the beam exits from the optical system 2, and is incident to the fly-eye lens 3. The fly-eye lens 3 has an exit surface on which a number of secondary light sources are formed from the incident beam. Thus, the secondary light sources emit illumination light pulses which are collected by the condenser lens 4 and then pass through the fixed field stop 5 to reach the movable blind 7. Although FIG. 1 shows the field stop 5 disposed on the same side as the condenser lens 5 with respect to the movable blind 7, the field stop 5 may be alternatively disposed on the same side as the relay lens system 8 with respect to the movable blind 7.

The field stop 5 has a rectangular, slit-shaped aperture. Therefore, the light beam has a rectangular, slit-shaped cross-section after passing through the field stop 5, and the light beam is then incident to the relay lens system 8. The relay lens system 8 establishes the optically conjugate relation between the plane of the movable blind 7 and the patterned surface of the reticle R. The movable blind 7 comprises a first pair of blades (light-blocking plates) 7A and 7B for defining the width of the light beam in the scanning direction (X-direction) as described in detail below, and a second pair of blades (not shown) for defining the width of the light beam in the direction perpendicular to the scanning direction. The first pair of blades 7A and 7B for defining the width of the light beam in the scanning direction are supported and driven by a pair of drive mechanisms 6A and 6B, respectively, for independent movement in the scanning direction. In this embodiment, the region which can be illuminated with the pulsed illumination light is confined to be within the slit-shaped illumination field 21 on the reticle R as defined by the fixed field stop 5, and is further limited within the desired exposure field as defined by the movable blind 7. The relay lens system 8 is a both-sided telecentric system and maintains the telecentricity within the slit-shaped illumination field 21 on the reticle R.

The reticle R is fixedly held on a reticle stage 26 by means of a vacuum chuck (not shown). The image of the circuit patterns of the reticle R is trimmed or limited by the slit-shaped illumination field 21 and the movable blind 7, and then projected onto the wafer W for exposure. The field on the wafer W that is optically conjugate to the slit-shaped illumination field 21 with respect to the projection optical system 13 provides a slit-shaped exposure field 22. The scanning direction (i.e., moving direction) of the reticle R is expressed relative to the fixed slit-shaped illumination field 21 in a two-dimensional plane perpendicular to the optical axis of the projection optical system 13 as the "X-direction" (or "–X-direction"), the direction perpendicular to the X-direction and perpendicular to the sheet surface of the drawing as the "Y-direction", and the direction parallel to the optical axis of the projection optical system 13 as the "Z-direction".

The reticle stage 26 is supported on the reticle base 9 and driven by the reticle stage drive mechanism 10 so that the reticle R is scanned in the X-direction (or –X-direction). The movable blind 7 is driven by the drive mechanisms 6A and 6B under the control of the movable blind controller 11 so that the movable blind 7 is also scanned in the X-direction (or –X-direction). A movable mirror 27 fixed on one end of the reticle stage 26 and a laser interferometer 28 provided at a place exterior to the reticle base 9 are used to continuously measure the X-coordinate of the position of the reticle stage 26, and the results of the measurement are supplied as a feedback into the reticle stage drive mechanism 10. The reticle stage drive mechanism 10 uses the X-coordinate measurement supplied as the feedback to establish the position and the scanning velocity of the reticle stage 26 to be equal to the values established by a main control system 12. The main control system 12 also controls the operation of the movable blind controller 11, as well as the operation of the entire apparatus. The reticle stage 26 actually provides additional functions to adjust the position of the reticle R in the Y-direction as well as in the rotational direction.

The wafer W is supported on the wafer stage 14 through a wafer holder 29. The wafer stage 14 comprises an XY-stage for positioning the wafer W in a plane perpendicular to the optical axis of the projection optical system 13 and for scanning the wafer W in the ±X-directions and a Z-stage for positioning the wafer W in the Z-direction. An L-shaped movable mirror 30 fixed on one end of the wafer holder 29 and a laser interferometer 31 provided at an external place are used to continuously measure the X- and Y-coordinates of the position of the XY-stage in the wafer stage 14, and the measured coordinates are supplied as a feedback into the wafer stage drive mechanism 15. The wafer stage drive mechanism 15 uses the measured coordinate to establish the position and the velocity of the wafer stage 14 to be equal to the values established by the main control system 12.

When the image of the pattern on the reticle R is projected for exposure on each shot-area on the wafer W, through the projection optical system 13, using a scanning exposure technique, the reticle R is scanned relative to the slit-shaped illumination field 21 in the X-direction (or in the –X-direction) at velocity $V_R$. The projection optical system 13 has a magnification ratio $\beta$. In synchronism with this scanning of the reticle R, the wafer W is scanned relative to the slit-shaped exposure field 22 in the –X-direction (or in the X-direction) at velocity $V_W(=\beta \times V_R)$. In this manner, the image of the circuit pattern on the reticle R is serially transferred onto each shot-area on the wafer W.

As shown in FIG. 1, a beam splitter 23 having a relatively high transmittance (i.e., low reflectivity) is disposed between the fly-eye lens 3 and the condenser lens 4. That portion of the pulsed illumination light which is reflected by the beam splitter 23 passes through a condenser lens 24 and is received by a photoelectric detector 25 which may comprise a photomultiplier (or alternatively, a PIN-type photodiode). The detection signal from the photoelectric detector 25 is supplied into an exposure control system 18. The detection signal is used by the exposure control system 18 to determine the exposure energy (pulse energy) of each illumination light pulse. A product of the averaged value of the pulse energy and the number of illumination light pulses emitted per unit time (emission frequency) provides the illuminance of the pulsed illumination light.

The exposure control system 18 uses the illuminance of the pulsed illumination light and obtains from it the desired correction in the illuminance and the scanning velocity $V_W$ of the wafer W (or the scanning velocity $V_R$ of the reticle R) in order to achieve an appropriate exposure of the photoresist coated on the wafer W. The amount of exposure of the wafer W may be adjusted by varying the width of the slit-shaped exposure field 22; however, in the present embodiment, the width of the exposure field 22 is defined by the fixed field stop 5, so that the width of the exposure field 22 is not adjusted.

When it is required to make a correction in the illuminance, the exposure control system 18 adjusts the emission energy of the excimer laser source 1 by controlling the power supply 19 for the laser source 1. This manner of correction is selected because excimer laser sources can provide the adjustment of its averaged pulse energy over a certain range by adjusting the supply voltage thereto. On the other hand, when it is not required to make any correction in the illuminance while a correction in the scanning velocity $V_W$ of the wafer W is required, or when corrections in both the illuminance and the scanning velocity $V_W$ are required, the exposure control system 18 outputs, to the main control system 12, the scanning velocity $V_W$ obtained based on the measured illuminance. The main control system 12, in response to it, reestablishes the adjusted scanning velocities $V_R$ and $V_W$ to the reticle stage drive mechanism 10 and the wafer stage drive mechanism 15, respectively.

Next, an example of the exposure operation of the present embodiment will be described. In recent years, reticles having a plurality of circuit pattern regions defined thereon are often used in order to eliminate the necessity of replacing reticles with different patterns so as to save time and improve throughput. The reticle R used in the present embodiment is one such reticle and has two different circuit pattern regions defined thereon. Therefore, the movable blind 7 is used to select one of the circuit pattern regions as a region whose image is to be projected or transferred onto the wafer W. Further, the projection exposure apparatus of the present embodiment has an input unit 16 for inputting the information about the circuit pattern regions of the reticle R, and a memory unit 17 for storing the information. The main control system 12 uses the information stored in the memory unit 17 to drive the blades 7A and 7B of the movable blind 7 in a predetermined sequence, via the movable blind controller 11 and the drive mechanisms 6A and 6B.

Figure 2A:
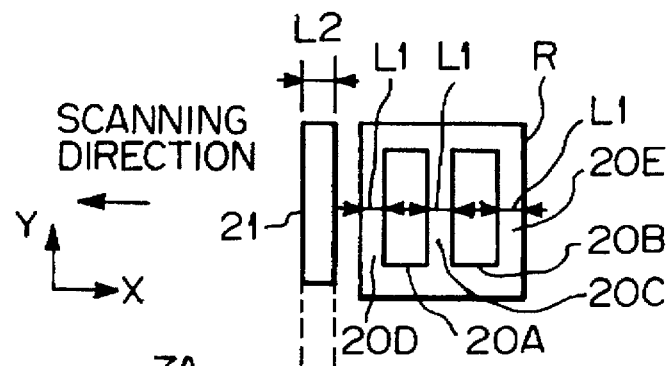
FIGS. 2(a)–2(f) illustrate an example of circuit pattern regions defined on the reticle shown in FIG. 1 and an example of a scanning exposure operation which may be performed by the scanning exposure apparatus of FIG. 1.
Figure 2B:
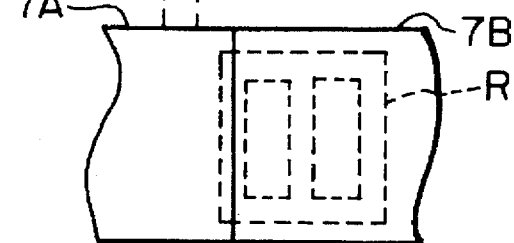

FIG. 2(a) shows the reticle R and the illumination field 21. As shown in FIG. 2(a), there are two circuit pattern regions 20A and 20B defined on the reticle R. A light-blocking region (or light-blocking band) 20C, having a width L1 in the scanning direction, is defined on the border between the two regions 20A and 20B. Further, light-blocking regions 20D and 20E having the same width L1 as that of the region 20C are defined along the respective outer sides of the two circuit pattern regions 20A and 20B. The slit-shaped illumination field 21 on the reticle R of this example is, as shown in FIG. 2(a), of an elongated rectangular shape having a width L2 in the scanning direction. The width L1 of the light-blocking regions 20C, 20D and 20E is selected to be smaller than the width L2 of the illumination field 21 (i.e., L1<L2).

In operation, first, the operator of the scanning exposure apparatus inputs the information about the circuit pattern regions 20A and 20B of the reticle R into the memory unit 17 from the input unit 16. If the image of the pattern of the first circuit pattern region 20A is to be transferred through the projection optical system 13 onto the wafer W, the main control system 12 reads out a part of the information stored in the memory unit 17 which part relates to the first circuit pattern region 20A. The main control system 12 uses the part of the information from the memory unit 17 to control, through the movable blind controller 11, the positions of the blades 7A and 7B of the movable blind 7 in the scanning direction. Through the control by the main control system 12, as shown in FIGS. 2(b) to 2(f), the second circuit pattern region 20B on the reticle R remains covered by one blade 7B while only the first circuit pattern region 20A is illuminated with the illumination light when passing through the slit-shaped illumination field 21. For the explanation purpose, FIG. 2 illustrates the blades 7A and 7B of the movable blind 7 as if they were overlaid on the reticle R; however, actually, the images of the blades 7A and 7B are projected onto the reticle R.

Specifically, the main control system 12 in FIG. 1 drives the reticle stage 26 through the reticle stage drive mechanism 10 to move the reticle R to the position where the slit-shaped illumination field 21 lies on the left hand side to the first circuit pattern region 20A of the reticle R as shown in FIG. 2(a). Then, the main control system 12 shut the blades 7A and 7B and move them to the position where the border between them coincides with the light-blocking region 20D. The main control system 12 in FIG. 1 then actuates the excimer laser source 1 through the exposure control system 18 to cause the excimer laser source 1 to emit light pulses. During the time while the blades 7A and 7B are closed, pulsed illumination light reflected by the beam splitter 23 is received by the photoelectric detector 25 as shown in FIG. 1. Therefore, the exposure control system 18 uses the detection signal from the photo-electric detector 25 to measure the illuminance of the pulsed illumination light, and further determines from the measured illuminance the desired correction in the emission energy of the excimer laser source 1 and/or the desired correction in the scanning velocity $V_W$ of the wafer W.

Figure 2C:
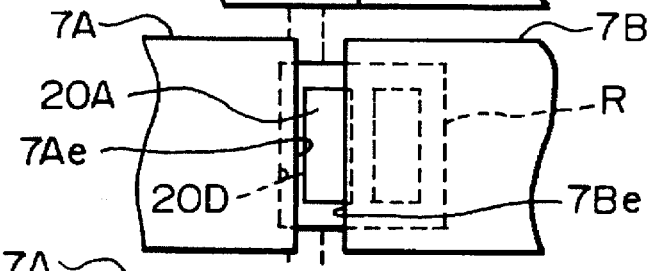

Then, the reticle stage 26 and the drive mechanism 6A (FIG. 1) are driven so as to synchronously move the reticle R and the blade 7A in the −X-direction (i.e., scanning direction) as shown in FIG. 2(c). It is noted that the actual blade 7A is moved in the opposite to said −X-direction, that is, X-direction as seen from FIG. 1; however, the term "blade " as used in relation to FIGS. 2(a)–2(f) means the projected image of the blade, and the image of the blade 7A moves in the −X-direction because the direction of the movement of the image is inverted from that of the actual blade through the relay lens system 8. Thus, the blades 7A and 7B in FIGS. 2(a)–2(f) (i.e., their projected images) are scanned in the same direction as the reticle R. During this scanning, the circuit pattern in the first circuit pattern region 20A, which lies between the right edge 7Ae of the left blade 7A and the left edge 7Be of the right blade 7B, passes through the illumination field 21 and thereby the circuit pattern being exposed onto the wafer W.

Figure 2D:
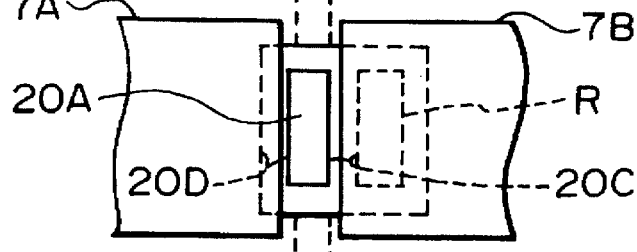
Figure 2E:
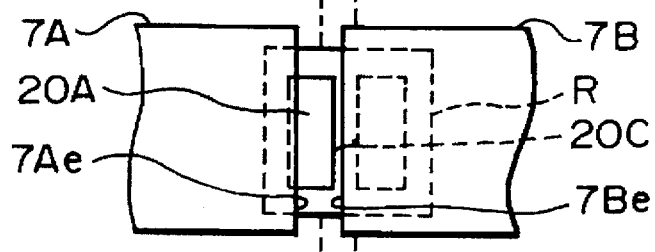
Figure 2F:
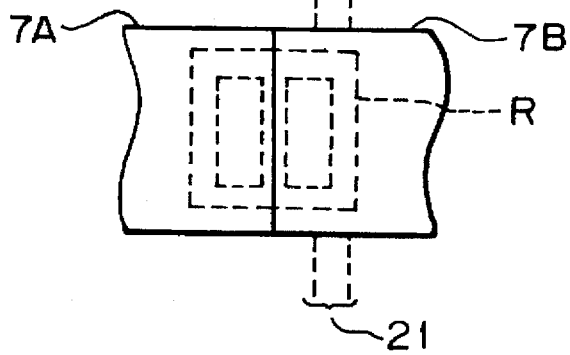

As shown in FIG. 2(d), when the right edge 7Ae of the left blade 7A passes over the left border of the illumination field 21, the left blade 7A starts decelerating. At this time, as shown in FIG. 2(e), the light-blocking region 20C get coincident with the left edge 7Be of the right blade 7B. Thereafter, the blade 7B is scanned in the −X-direction in synchronism with the reticle R. When the first circuit pattern region 20A, the left one of the two circuit patterns seen in FIG. 2(f), has passed through the illumination field 21 and thus the exposure operation for one shot-area has been completed, the reticle R and the blade 7B starts decelerating. When the reticle R finally stops, as shown in FIG. 2(f), the blades 7A and 7B also stop to close over the light-blocking region 20C. At this time, the emitting operation of the excimer laser source 1 of FIG. 1 ceases as well.

On the other hand, the main control system 12 drives the wafer stage 14 via the wafer stage drive mechanism 15, so as to scan the wafer W in the scanning direction (i.e., the X-direction) in synchronism with the movements of the reticle R and the movable blind 7. With the projection magnification ratio of the projection optical system 13 for projecting from the reticle R to the wafer W being β, the synchronization maintains the relation $V_W=\beta \times V_R$, where $V_R$ represents the scanning velocity of the reticle R in the −X-direction (or X-direction) and $V_W$ represents the scanning velocity of the wafer W in the X-direction (or −X-direction), during the exposure operation. In the exemplified case described above, since only the first circuit pattern region 20A on the reticle R is illuminated with the pulsed illumination light, only the image of the circuit pattern in the first circuit pattern region 20A is transferred onto the wafer W. When the reticle R is scanned relative to the illumination field 21 in the opposite direction to that of the above exemplified case (i.e., when it is scanned in the X-direction), the blades 7A and 7B of the movable blind 7 are controlled in the inverted sequence, i.e., in the inverted order in FIGS. 2(f) to 2(b).

During this exposure process, according to the present embodiment, the illuminance of the pulsed illumination light (i.e., pulse energy) is measured after the loading of the wafer (not before the loading of the wafer unlike conventional methods) and just before the exposure operation, and the illuminance and/or the scanning velocities are adjusted based on the measured illuminance, so that the amount of exposure of the wafer W can be controlled to a desired amount of exposure with high precision. The illuminance may be measured during a time period in which the reticle R is accelerated ("acceleration period" hereinafter) with the movable blind 7 being closed, so that the illuminance measurement can be performed with high precision without any undesirable exposure onto the wafer W. It is contemplated to change the number of light pulses emitted onto the wafer W by adjusting the emission intervals of the light pulses during the time period in which a certain point on the wafer W passes through (or crosses) the exposure field on the wafer W along the scanning direction, on which field of the reticle pattern is projected through the projection optical system 13, (i.e., the field which is analogous to the illumination field 21 on the reticle R). Further, it is also contemplated to vary the width of the exposure field in the scanning direction. The amount of exposure of the wafer (or photoresist) may be adjusted by either of these method. In any case, it is desirable that the number of light pulses emitted during the time period in which a certain point on the wafer W passes through the exposure field should be an integer number.

Alternatively, as shown in FIG. 2(f), the illuminance may be measured during a time period in which the reticle R is decelerated after completion of the scanning exposure process of one shot-area with the blades 7A and 7B of the movable blind 7 being closed again, and determine based on the measured illuminance the desired correction in the illuminance and/or the desired correction in the scanning velocities for the exposure operation of the next shot-area. Further, the illuminance may be measured during a time period in which the reticle R remains stationary.

Figure 3:
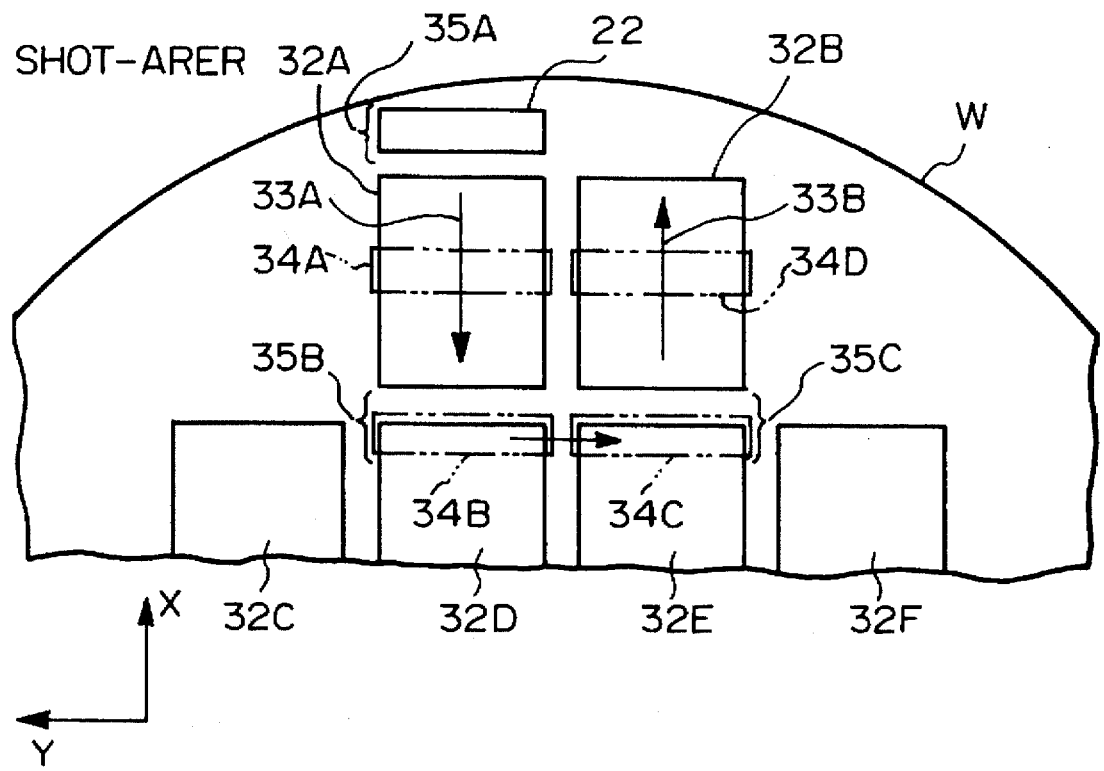
FIG. 3 is a partial enlarged plan view showing an arrangement of shot-areas on the wafer which may be exposed in the embodiment in FIG. 1, and the locus of the movement of the slit-shaped exposure field relative to the wafer.
Figure 4:
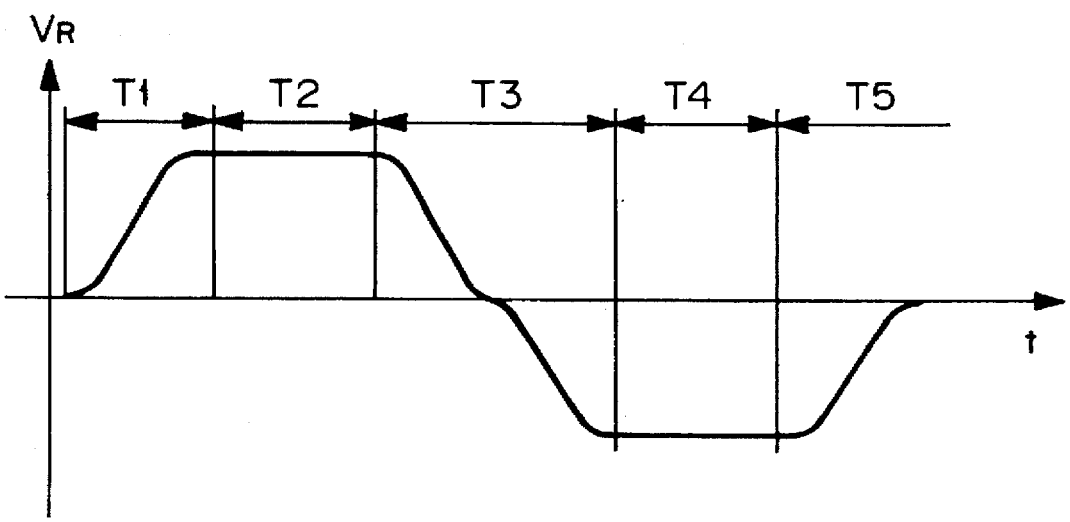
FIG. 4 is a plot showing an example of the scanning velocity of the reticle varying with time.

FIGS. 3 and 4 show one example of an exposure process in which two different circuit patterns of the circuit pattern regions 20A and 20B on the reticle R are successively projected for exposure onto each shot-area on the wafer W, using successive scanning exposure technique.

FIG. 3 shows an arrangement of shot-areas on the wafer W, in which multiple shot-areas 32A, 32B, 32C, . . . are arranged on the wafer W extending in the X-direction (i.e., the scanning direction) as well as the Y-direction with a predetermined spacing or gap between adjacent shot-areas. The images of the circuit patterns on the reticle R are transferred onto each shot-area using the scanning exposure technique. During the exposure operation, any regions other than the circuit pattern regions 20A and 20B and the light-blocking regions on the reticle R are prevented from being illuminated with the pulsed illumination light by virtue of the operation of the movable blind 7, so that any exposure of undesirable patterns are prevented.

When the first shot-area 32A on the wafer W is exposed, the shot-area 32A is accelerated and moved in the +X-direction relative to the slit-shaped exposure field 22 (which is actually further limited by the movable blind 7) with the excimer laser source 1 being actuated to emit light pulses. For this, the wafer W is accelerated within an acceleration region 35A to reach a predetermined constant scanning velocity. Thereafter, the exposure field 22 makes relative movement to the wafer W along the locus 33A, to pass through a position 34A to reach a position 35A, during which movement the image of the circuit pattern on the reticle R is serially projected for exposure onto the shot-area 32A. Then, the wafer W is decelerated within the region 35B between the shot-area 34A and the position 34B (this region is called "deceleration region").

The wafer stage 14 (shown in FIG. 1) is then stepped in the Y-direction, by which the slit-shaped exposure field 22 moves from the position 34B to a position 34C adjacent to the second shot-area 32B. Then the second shot-area 32B is accelerated to move in −X-direction relative to the slit-shaped exposure field 22, and the wafer W reaches the predetermined constant scanning velocity within the acceleration region 35C. Thereafter, the exposure field 22 makes relative movement to the wafer W along the locus 33B, to pass through a position 34D to go out of the shot-area 32B, during which movement the image of the circuit pattern on the reticle R is serially projected for exposure onto shot-area 32B.

FIG. 4 shows how the scanning velocity $V_R$ of the reticle R varies during the above exposure operations. In FIG. 4, the scanning velocity $V_R$ increases to reach a predetermined value during the acceleration period T1 corresponding to the acceleration region 35A, and is kept at the predetermined value (i.e., at a constant velocity) during the following exposure period T2. During the deceleration/acceleration period T3 corresponding to the deceleration region 35B and the acceleration region 35C both shown in FIG. 3, the scanning velocity $V_R$ of the reticle R decreases to zero and subsequently increases in the negative direction to reach the predetermined value. The scanning velocity $V_R$ is kept at the predetermined value (i.e., at the constant velocity) during the following exposure period T4, and then decreases to zero again during the period T5. In FIG. 3, when the third shot-area 32C and the subsequent shot-areas are exposed, the scanning direction of the wafer W may, for example, be set such that the scanning direction of the reticle R may serially be reversed.

In the present embodiment, during the above exposure operations, the amount of exposure of the first shot-area 32A onto the wafer W is controlled based on the illuminance measured when the exposure field 22 was in the acceleration region 35A. Similarly, the amount of exposure of the second shot-area 32B is controlled based on the illuminance measured when the exposure field 22 was in the acceleration region 35C which precedes the second shot-area 32B. This provides a highly precise control of the amount of exposure for each shot-area. Further, since this eliminates the necessity to use a separate (or independent) illuminance measuring time, a reduction of the throughput of the exposure process can be prevented. Alternatively, the illuminance of the pulsed illumination light may be measured in the deceleration region 35B associated with the first shot-area 32A, or in the stepping region through which the exposure field 22 moves from the deceleration region 35B to the next acceleration region 35C, and the control of the amount of exposure for the second shot-area 32B may be made based on the illuminance measured described above.

If the excimer laser source 1 used has a characteristic that its pulse energy varies only in a relatively long interval, it is not necessary to measure the illuminance so frequently, that is, for each shot-area in the associated acceleration or deceleration period. Namely, but perhaps one measurement for every two of three shot-areas may be sufficient for the purpose.

Figure 5:
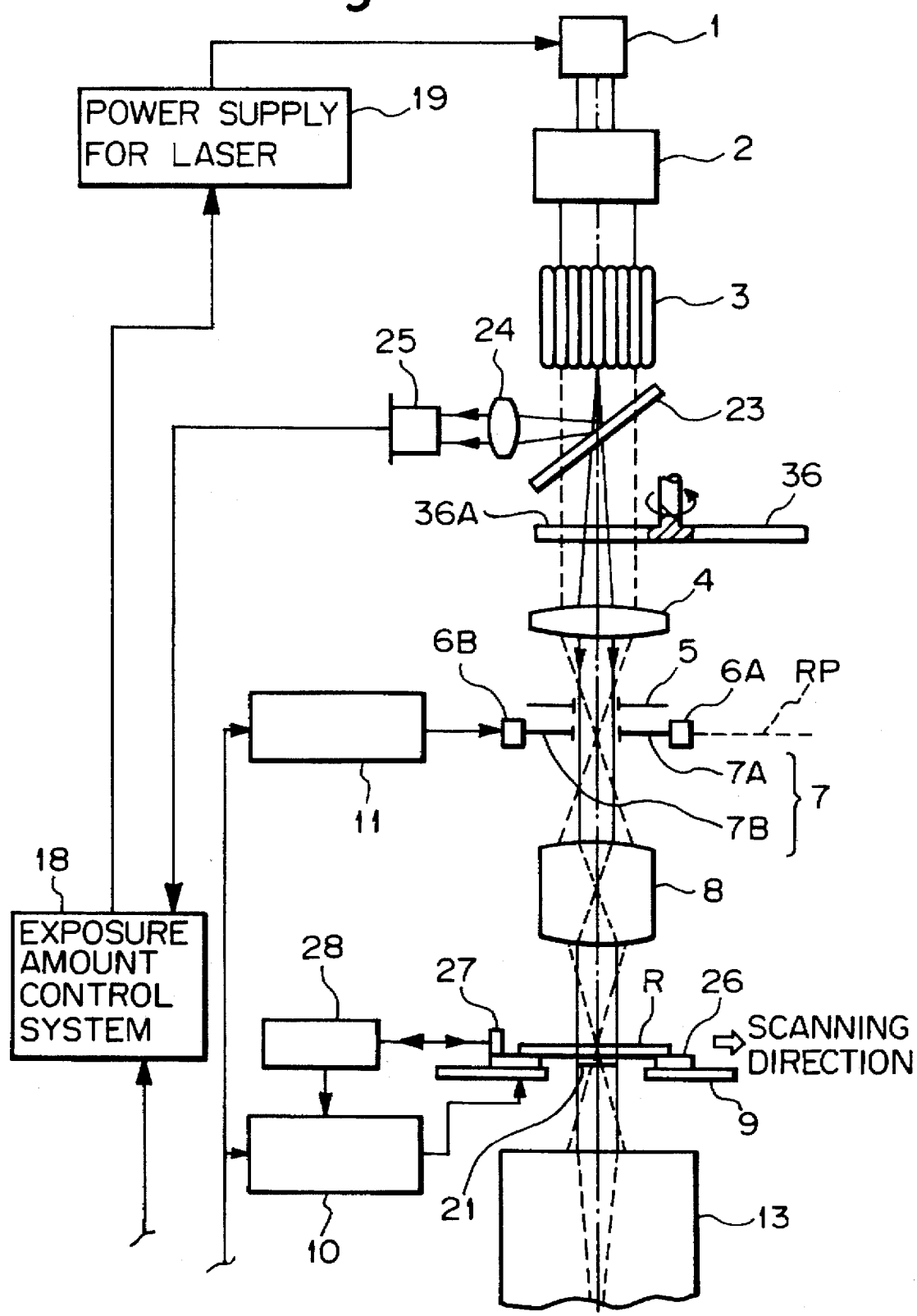
FIG. 5 is a schematic showing another embodiment of a scanning exposure apparatus according to the present invention in which a rotary shutter is added to the embodiment shown in FIG. 1.

As shown in FIG. 5, a rotary shutter 36, which may comprise, for example, four blades 36A circumferentially spaced by 90 degrees from each other, may be disposed between the beam splitter 23 and the condenser lens 4 for blocking the pulsed illumination light by the blade 36A of the shutter 36, so as to prevent any undesirable and inadvertent exposure of the wafer W, if desirable to do so. Further, the axis of the shutter 36 may be arranged obliquely to the optical axis of the illumination optical system, so that the illumination light may be reflected by the blade 36A and directed, in the direction oblique to the optical axis, to the photoelectric detector 25 when the shatter 36 closes the optical pass. In such a case, the shutter may be disposed at any position between the photoelectric detector 25 (or the beam splitter 23 for directing the light to the photoelectric detector 25) and the wafer W. It is only necessary to select the positions of the photoelectric detector 25 and the shutter 36 such that the illumination light can be received by the photoelectric detector 25 and can never reach the wafer W when it is undesirable. Specifically, if a member is disposed on the illumination light path, which member is not the shutter 36, for directing at least a portion of the illumination light to the photoelectric detector 25 (this member comprises the beam splitter 25 in the arrangement of FIG. 5), the shutter 36 may be disposed between this member and the wafer W. On the other hand, if the shutter 36 also serves as the member for directing at least a portion of the illumination light to the photoelectric detector 25 (or alternatively, if the photoelectric detector 25 is disposed directly on one of the blades 36A of the shutter 36 as described below), the shutter may be disposed at any position between the exposure light source 1 and the wafer W.

The photoelectric detector 25 may be disposed directly on one of the blades 36A of the rotary shutter. Alternatively, the photoelectric detector 25 may be disposed on the reticle stage 26 and the illuminance may be measured just before or after the scanning exposure operation of one shot-area.

As a further option, two photoelectric detectors may be disposed on the reticle stage 26 along a certain line extending in the scanning direction and on the opposite sides to the reticle R, so that either of the photoelectric detectors always precedes the reticle R to pass through the illumination field 21 irrespective of the scanning directions of +X-direction or the -X-direction. In this arrangement, the illuminance can always be measured before the scanning exposure operations whether the reticle stage 26 is scanned in the +X-direction or the -X-direction. Further, in this arrangement, it is preferable to use a shutter (or light-blocking plate) for cutting any light which could otherwise pass through the reticle R and the projection optical system 13 to reach the wafer W. On the other hand, in the embodiment in FIG. 1 where the movable blind 7 is used to block the illumination light, since the movable blind 7 also serves as a shutter, a more simple arrangement is achieved. In the arrangement described above, the rotary shutter 36 can be replaced by a reciprocating shutter.

Although the excimer laser source 1 is used as the exposure light source in the embodiment in FIG. 1, various continuous light sources such as the mercury vapor lamp may also be used with the present invention as the exposure light source. When a continuous light source is used, the exposure may be controlled by adjusting at least one of i) the illuminance of the light source, ii) the scanning velocities of the reticle and the wafer and iii) the width, in the scanning direction, of the illumination field on the reticle (i.e., the width of the aperture in the scanning direction when the fixed field stop 5 is replaced by a variable stop). In general, the illuminance of a continuous light source varies only in a relatively long interval, the illumination measurement may be made less frequently than that with the pulsed light sources. Further, it is to be understood that the present invention is not limited to the projection exposure apparatuses, but can be applied to various other exposure apparatuses such as those using the contact exposure method and the proximity exposure method. Therefore, the present invention is not limited to the embodiments described above, but may be embodied in various other forms without departing from the spirit and the scope of the present invention as defined in the appended claims.

What is claimed is:

1. A scanning exposure apparatus comprising:

an illumination optical system for illuminating, with an illumination light for exposure, an illumination field of a predetermined shape on a mask, said mask having a transfer pattern formed thereon which is to be transferred onto a photosensitive substrate;

a scanning stage for synchronously scanning said mask and said substrate;

an illuminance measuring device for measuring the illuminance of said illumination light during a time period when said illumination field of said predetermined shape is positioned in a region other than that of said transfer pattern on said mask, wherein said transfer pattern is completely shielded from said illumination light during said time period; and an exposure control device for controlling the amount of exposure onto said substrate when an image of said transfer pattern on said mask is projected for scanning exposure onto said substrate based on the results of the measurement from said illumination measuring device.

2. A scanning exposure apparatus according to claim 1, wherein:

said exposure control device controls the amount of exposure onto said substrate by controlling at least one of i) the scanning velocities of said mask and said substrate, ii) the illuminance of said illumination light emitted from said illumination optical system onto said mask and iii) the width, in said scanning direction of said mask, of said illumination field of said predetermined shape.

3. A scanning exposure apparatus according to claim 1, further comprising:

a shutter member disposed in said illumination optical system, for blocking said illumination light during a time period when said illumination field of said predetermined shape is positioned in a region other than that of said transfer pattern on said mask;

wherein said illuminance measuring device is disposed between said shutter member and an exposure light source in said illumination optical system.

4. A scanning exposure apparatus according to claim 3, wherein:

said shutter member is disposed between said illuminance measuring device and said substrate and comprises a dedicated member (36) to be used exclusively as a shutter.

5. A scanning exposure apparatus according to claim 3, wherein:

said shutter member is disposed in said illumination optical system and in a plane which is substantially optically conjugate to a surface of said mask on which said transfer pattern is formed, and said shutter member comprises a variable field stop (7A, 7B) which is capable of changing the width, in the scanning direction of said mask, of said illumination field of said predetermined shape.

6. A scanning exposure apparatus according to claim 1, wherein:

said time period when said illumination field of said predetermined shape is positioned in a region other than that of said transfer pattern on said mask and when said illuminance measuring device measures the illuminance of said illumination light is at least one of i) an acceleration period in which said mask and said substrate are running in synchronism with each other while being accelerated, ii) a deceleration period in which said mask and said substrate are running in synchronism with each other while being decelerated and iii) a transfer period in which an exposure field is moved from one shot-area to another.

7. A scanning exposure apparatus comprising:

an illumination optical system for illuminating, with an illumination light for exposure, an illumination field of a predetermined shape on a mask, said mask having a transfer pattern formed thereon which is to be transferred onto a photosensitive substrate;

a scanning stage for synchronously scanning said mask and said substrate;

an illuminance measuring device for measuring the illuminance of said illumination light during a time period when said illumination field of said predetermined shape is positioned in a region other than that of said transfer pattern on said mask, wherein said transfer pattern is completely shielded from said illumination light during said time period; and an exposure control device for controlling the amount of exposure onto said substrate when an image of said transfer pattern on said mask is projected for scanning exposure onto said substrate based on the results of the measurement from said illumination measuring device; and a variable field stop disposed in said illumination optical system and in a plane which is substantially optically conjugate to a surface of said mask on which said transfer pattern is formed, for changing the width, in the scanning direction of said mask, of said illumination field of said predetermined shape.

8. A scanning exposure apparatus according to claim 7, wherein:

said exposure control device controls the amount of exposure onto said substrate by controlling at least one of i) the scanning velocities of said mask and said substrate, ii) the illuminance of said illumination light emitted from said illumination optical system onto said mask and iii) the width, in said scanning direction of said mask, of said illumination field of said predetermined shape.

9. A scanning exposure apparatus according to claim 7, further comprising:

a shutter member disposed in said illumination optical system, for blocking said illumination light during a time period when said illumination field of said predetermined shape is positioned in a region other than that of said transfer pattern on said mask;

wherein said illuminance measuring device is disposed between said shutter member and an exposure light source in said illumination optical system.

10. A scanning exposure apparatus according to claim 9, wherein:

said shutter member is disposed between said illuminance measuring device and said substrate and comprises a dedicated member (36) to be used exclusively as a shutter.

11. A scanning exposure apparatus according to claim 9, wherein:

said variable field stop (7A, 7B) is also capable of serving as said shutter member.

12. A scanning exposure apparatus according to claim 7, wherein:

said time period when said illumination field of said predetermined shape is positioned in a region other than that of said transfer pattern on said mask and when said illuminance measuring device measures the illuminance of said illumination light is at least one of i) an acceleration period in which said mask and said substrate are running in synchronism with each other while being accelerated, ii) a deceleration period in which said mask and said substrate are running in synchronism with each other while being decelerated and iii) a transfer period in which an exposure field is moved from one shot-area to another.

13. A scanning exposure apparatus comprising:

an illumination optical system for illuminating a mask with a light beam:

a scanning system for synchronously scanning the mask and a substrate so as to project for exposure an image of a pattern on said mask onto said substrate;

a photoelectric detector for receiving at least a portion of said light beam during a time period when said transfer pattern is completely shielded from said illuminating light; and a device for adjusting, prior to a scanning exposure operation and in response to a signal from said photoelectric detector, at least one of i) the scanning velocities of said mask and said substrate, ii) the intensity of said light beam and iii) the width, in the scanning direction, of an illumination field on said mask, so as to provide a predetermined exposure dose to said substrate.

14. An apparatus according to claim 13, further comprising:

a light-blocking member for blocking any light which could otherwise reach said substrate when said light beam is received by said photoelectric detector.

15. An apparatus according to claim 14, wherein:

said light-blocking member comprises a shutter disposed between a light source for emitting said light beam and said substrate so that the light path of said light beam is blocked in precedence to the receipt of said light beam by said photoelectric detector.

16. An apparatus according to claim 15, further comprising:

a beam splitter disposed between said light source and said shutter so that a portion of said light beam is received by said photoelectric detector.

17. An apparatus according to claim 13, further comprising:

a stop member operating in relation to the scanning of said mask for changing the width of said illumination field.

18. An apparatus according to claim 17, wherein:

said stop member comprises a plurality of light-blocking plates defining an aperture allowing said light beam to pass therethrough; and wherein said apparatus further comprises a device for driving at least one of said plurality of light-blocking plates so as to block any light which could otherwise reach said substrate when said light beam is received by said photoelectric detector.

19. An apparatus according to claim 18, further comprising:

a beam splitter disposed between a light source for emitting said light beam and said stop member so that a portion of said light beam is received by said photoelectric detector.

20. A scanning exposure apparatus comprising:

a light source for emitting a pulsed light;

a variable field stop, disposed between a mask and said light source, which moves synchronously with said mask and a substrate to be exposed, said variable field stop being kept closed during an acceleration or a deceleration movement of said mask;

a measuring device disposed between said mask and said substrate, for measuring an energy of said pulsed light while the mask is accelerating or decelerating and while the variable stop is kept closed; and an adjusting device for adjusting a scanning exposure operation based on the result obtained from said measuring device so as to provide a predetermined amount of exposure light to said substrate.

21. A scanning exposure apparatus according to claim 20, further comprising a fixed field stop for defining an illumination area formed by said pulsed light, said variable field stop further defining another desirable area within said illumination area.

22. A scanning exposure apparatus comprising:

a light source for emitting a pulsed light;

a light-blocking member disposed between a mask and said light source and moving synchronously with said mask, so that a substrate is prevented from being undesirably exposed during acceleration and deceleration movement of said mask;

a measuring device disposed between said mask and said substrate, for measuring an energy of said pulsed light while the mask is accelerating or decelerating and while the substrate is prevented by said light-blocking member from being exposed; and an adjusting device for adjusting a scanning exposure operation based on the result obtained from said measuring device so as to provide a predetermined amount of exposure light to said substrate.

23. A scanning exposure apparatus according to claim 22, further comprising a fixed field stop for defining an illumination area formed by said pulsed light, said light-blocking member further defining another desirable area within said illumination area.

24. A scanning exposure method for scanningly exposing each of a plurality of shot-areas on a substrate by a pattern image of a mask comprising the steps of:

emitting a pulsed light;

exposing one shot-area of said plurality of shot-areas;

moving said substrate from one position where an exposure operation of said one shot-area has been finished, to another position where an exposure operation of a next-shot area is to start;

measuring an energy of said pulsed light during a movement of the substrate; and adjusting a scanning exposure operation based on the result of said measuring the energy of said pulsed light so as to provide a predetermined amount of exposure light to said next shot-area.

25. A scanning exposure method according to claim 24, wherein said pulsed light comprises an excimer laser.

26. A scanning exposure method according to claim 25, wherein said excimer laser comprises an ArF excimer laser.

27. A scanning exposure method according to claim 24, wherein an adjustment of said scanning exposure operation includes at least an adjustment of the emission of said pulsed light, an adjustment of a scanning velocity of said mask and said substrate and an adjustment of a width of the pulsed light in a direction of a movement of the substrate.

28. A scanning exposure method according to claim 27, wherein an adjustment of the emission of said pulsed light includes an adjustment of an emission interval of said pulsed light.

29. A scanning exposure method according to claim 27, wherein an adjustment of the emission of said pulsed light includes an adjustment of a voltage of an electric power supply of a light source emitting said pulsed light.

30. A scanning exposure method according to claim 24, wherein an adjustment of said scanning exposure operation is effected, so that the number of pulses of the pulsed light emitted onto each point of said next shot-area becomes an integer.

31. A scanning exposure method comprising the steps of:

emitting a pulsed light;

moving a mask and a substrate relative to said pulsed light, so that the substrate is scanningly exposed by a pattern of the mask;

measuring an energy of said pulsed light during an acceleration or a deceleration movement of said substrate; and adjusting at least one of an emission of said pulsed light, a scanning velocity of said mask and said substrate and a width of said pulsed light in a direction of the movement of said mask and said substrate, based on the result of the measuring the energy of said pulsed light, so that the number of pulses of the pulsed light emitted onto each point of said substrate during a scanning exposure operation becomes an integer.

32. A scanning exposure method according to claim 31, wherein said pulsed light comprises an excimer laser.

33. A scanning exposure method according to claim 32, wherein said excimer laser comprises an ArF excimer laser.

34. A scanning exposure method according to claim 31, wherein an adjustment of the emission of said pulsed light includes an adjustment of an emission interval of said pulsed light.

35. A scanning exposure method according to claim 31, wherein an adjustment of the emission of said pulsed light includes an adjustment of a voltage of an electric power supply of a light source emitting the pulsed light.

36. A scanning exposure method comprising the steps of:

emitting a pulsed light;

moving a substrate relative to said pulsed light, so that the substrate is scanningly exposed by a pattern of a mask;

measuring an energy of said pulsed light during an acceleration or a deceleration movement of said substrate; and adjusting an emission interval of said pulsed light based on the result of said measuring the energy of said pulsed light, so that the substrate is exposed with a predetermined amount of exposure light.

37. A scanning exposure method according to claim 36, wherein said pulsed light comprises an excimer laser.

38. A scanning exposure method according to claim 37, wherein said excimer laser comprises an ArF excimer laser.

39. A scanning exposure method according to claim 36, wherein an adjustment of the emission interval of said pulsed light is effected, so that the number of pulses of the pulsed light emitted onto each point of said substrate becomes an integer.

40. A scanning exposure method comprising steps of:
emitting a pulsed light;
moving a substrate relative to said pulsed light in a scanning direction, so that the substrate is scanningly exposed by a pattern of a mask;
measuring an energy of said pulsed light during an acceleration or a deceleration movement of said substrate; and
adjusting a width of said pulsed light in said scanning direction based on the result of said measuring the energy of said pulsed light, so that the substrate is exposed with a predetermined amount of exposure light.

41. A scanning exposure method according to claim 40, wherein said pulsed light comprises an excimer light.

42. A scanning exposure method according to claim 41, wherein said excimer laser comprises an ArF excimer laser.

43. A scanning exposure method according to claim 40, wherein an adjustment of the width of said pulsed light in said scanning direction is effected, so that the number of pulses of the pulsed light emitted onto each point of said substrate becomes an integer.

44. A scanning exposure method comprising the steps of:
emitting a pulsed light;
moving a mask and substrate relative to said pulsed light in a scanning direction, so that the substrate is scanningly exposed by a pattern of a mask;
moving a light-blocking member synchronously with a movement of the mask, so that the substrate is prevented from being subject to an undesirable exposure during an acceleration or a deceleration movement of said mask;
measuring an energy of said pulsed light while said mask is accelerating or decelerating and while the substrate is prevented from being subject to the undesirable exposure by said light-blocking member; and
adjusting a scanning exposure operation based on the result of said measuring the energy of said pulsed light so as to provide a predetermined exposure dose to said substrate.

45. A scanning exposure method according to claim 44, wherein said pulsed light comprises an excimer laser.

46. A scanning exposure method according to claim 45, wherein said excimer laser comprises an ArF excimer laser.

47. A scanning exposure method according to claim 44, wherein an adjustment of said scanning exposure operation includes at least an adjustment of said pulsed light, an adjustment of a scanning velocity of said mask and said substrate and an adjustment of the emission of a width of the pulsed light in said scanning direction.

48. A scanning exposure method according to claim 47, wherein an adjustment of the emission of said pulsed light includes an adjustment of an emission interval of said pulsed light.

49. A scanning exposure method according to claim 47, wherein an adjustment of the emission of said pulsed light includes an adjustment of a voltage of an electric power supply of a light source emitting said pulsed light.

50. A scanning exposure method according to claim 44, wherein the adjustment of said scanning exposure operation is effected, so that the number of pulses of the pulsed light emitted onto each point of said substrate becomes an integer number.

51. A scanning exposure method comprising the steps of:
emitting a pulsed light;
moving a mask and substrate relative to said pulsed light in a scanning direction, so that the substrate is scanningly exposed by a pattern of a mask;
moving a variable field stop synchronously with a movement of the mask, said variable field stop being kept closed during an acceleration or a deceleration movement of the mask;
measuring an energy of said pulsed light while the mask is accelerating or decelerating and while said variable field stop is kept closed; and
adjusting a scanning exposure operation based on the result of said measuring the energy of said pulsed light so as to provide a predetermined exposure dose to said substrate.

52. A scanning exposure method according to claim 51, wherein said pulsed light comprises an excimer laser.

53. A scanning exposure method according to claim 52, wherein said excimer laser comprises an ArF excimer laser.

54. A scanning exposure method according to claim 51, wherein an adjustment of said scanning exposure operation includes at least an adjustment of the emission of said pulsed light, an adjustment of a scanning velocity of said mask and said substrate, and an adjustment of a width of the pulsed light in said scanning direction.

55. A scanning exposure method according to claim 54, wherein the adjustment of an emission of said pulsed light includes an adjustment of an emission interval of said pulsed light.

56. A scanning exposure method according to claim 54, wherein the adjustment of an emission of said pulsed light includes an adjustment of a voltage of an electric power supply of a light source emitting said pulsed light.

57. A scanning exposure method according to claim 51, wherein the adjustment of said scanning exposure operation is effected, so that the number of pulses of the pulsed light emitted onto each point of said substrate becomes an integer number.

* * * * *